United States Patent [11] 3,588,616

[72] Inventor Norman S. Palazzini
Holliston, Mass.
[21] Appl. No. 793,821
[22] Filed Jan. 24, 1969
[45] Patented June 28, 1971
[73] Assignee Sprague Electric Company
North Adams, Mass.

[54] COMPENSATION SUBSTRATE FOR DUAL IN LINE PACKAGE

5 Claims, 3 Drawing Figs.

Figures 1, 2, 3:
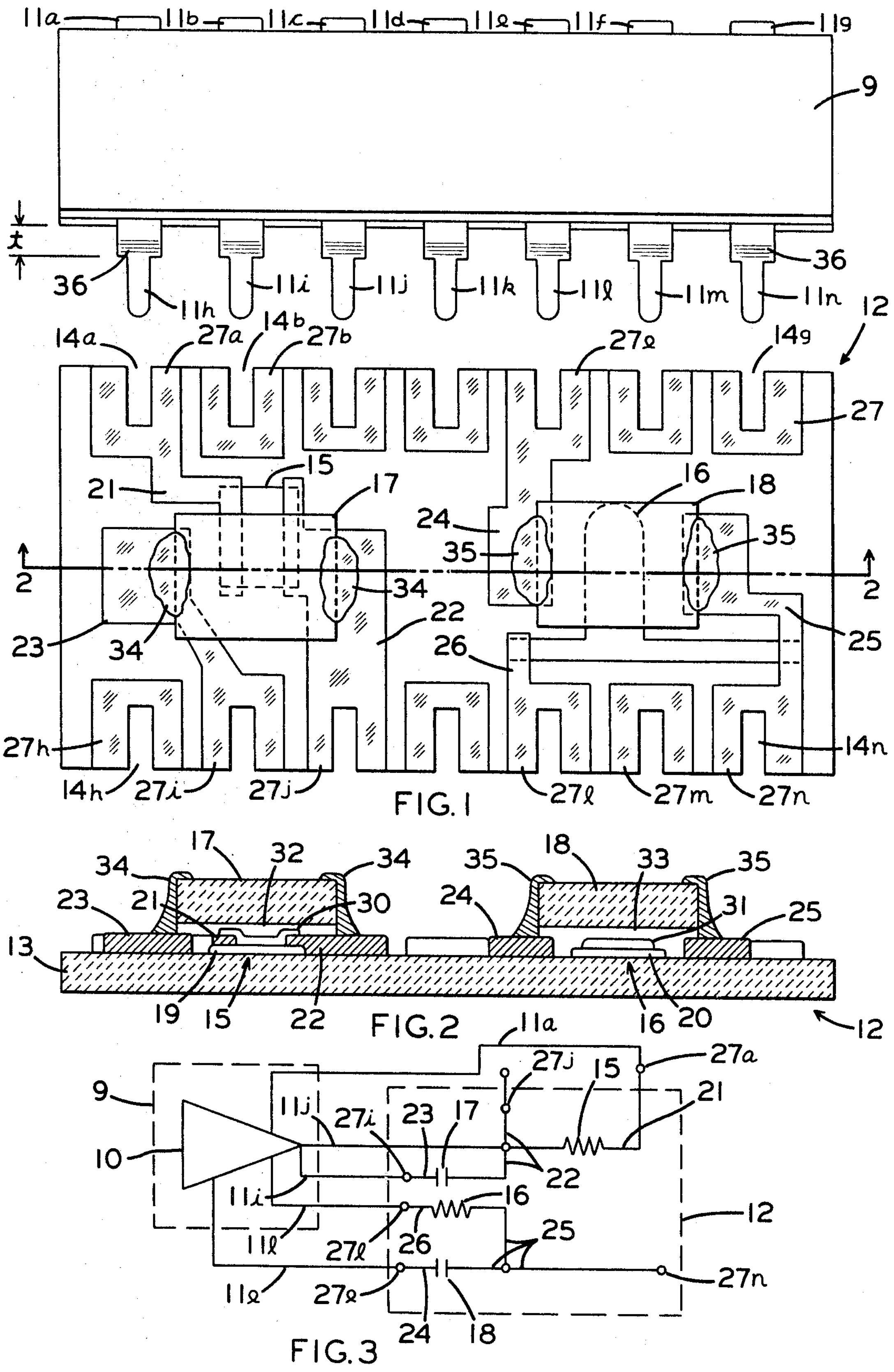

[52] U.S. Cl. ........ 317/101
[51] Int. Cl. ........ H05k 1/04
[50] Field of Search ........ 317/101, 101 (A), 101 (CM), 101 (D); 339/17, 17 (C), 17 (N)

[56] References Cited
UNITED STATES PATENTS 2,850,681 9/1958 Horton ........ 317/101D(UX)
2,984,768 5/1961 Henry ........ 317/101D(UX)
3,289,045 11/1966 Pritikin et al. ........ 317/101A(UX)
3,418,535 12/1968 Martinell ........ 317/101CM(UX)

OTHER REFERENCES

WYMA ET AL., " Packaging Circuit Components" , IBM Tech. Disclosure Bulletin, Vol. 2, No. 1, June 1959, pp. 10-11, (copy 317-101)
" Electronic Design" , April 26, 1962 pp. 40— 41. (Copy 317-101CC)

*Primary Examiner*—David Smith, Jr.
*Attorneys*—Connolly and Hutz, Vincent H. Sweeney, James Paul O'Sullivan and David R. Thornton ABSTRACT: A substrate having components formed by thick film techniques on one surface is connected to a dual in line package in a manner which interconnects the components with the circuit within the package. The substrate is designed to be wholly accommodated beneath the package with the package leads extending beneath the substrate making them available for both insertion into a printed circuit board and further interconnection.

COMPENSATION SUBSTRATE FOR DUAL IN LINE PACKAGE

BACKGROUND OF THE INVENTION

This invention relates to the installation of a dual in line package (DIP) on a printed circuit board and, in particular, to an improved interconnection of the DIP with those compensation and/or feedback components necessary to form a complete circuit.

Dual in line packages have found wide use as a means of providing a mounting and interconnection for a variety of integrated circuits. The DIP leads are bonded to appropriate portions of a microcircuit chip and the circuit and a portion of the leads are encapsulated in a plastic. The encapsulated circuit essentially is a basic unit such as an operational amplifier, free running multivibrator, digital circuit etc. which requires the addition of at least one and possible several compensating and/or feedback elements such as resistors and capacitors whose values will vary with the desired use of the basic unit. Heretofore, these components have been assembled in discrete form on a printed circuit board and then connected to the appropriate DIP leads. This procedure has several disadvantages: it is wasteful of space since the discrete components must be spread out around the leads; time must be taken laying out the components and connecting them, usually by soldering, to the appropriate lead and reliability is poor because of the number of connection points susceptible to failure.

It is therefore one object of the present invention to provide a combination of a DIP with its compensation components attached thereto, the combination occupying a smaller area on a printed circuit board when mounted thereon than heretofore.

It is another object to increase the reliability of such a combination.

It is a still further object to reduce the size of the components attached to the package by use of thin film techniques.

SUMMARY OF THE INVENTION

In the broadest sense, the present invention comprises an improved combination of a microcircuit formed as a dual-in-line package with a component or grouping of components required to be interconnected to the encapsulated circuit to form a desired final circuit. More particularly, the components are formed on, or attached to, the surface of a substrate and are in contact with conductive elements which terminate in or near cavities designed to accommodate the DIP leads. This arrangement permits the package to be joined to a substrate containing the requisite components; connection is made at the point where the inserted lead contacts a conductive element emanating from the components. The package and substrate are secured together by soldering or likewise securing the package leads to the conductive elements on the substrate. The combination can now be inserted in place on a printed circuit board with the lead ends projecting through the board and available for interconnection with similarly mounted combinations.

This arrangement results in a saving of space on the printed board since the additional components are now beneath the DIP rather than grouped around it. Overall reliability is increased because of fewer contact points required between component and DIP leads and the improved manner of making the present contacts. The use of a substrate permits the serial deposition of thin films of conducting, resistive and insulating materials to provide resistors, capacitors, and interconnections on the substrate surface eliminating the use of discrete components. This single mounting concept also reduces handling and storage problems associated with discrete elements.

DESCRIPTION OF THE INVENTION

FIG. 1 illustrates one embodiment of the invention and shows, in an exploded view, a dual in line package 9 having an operational amplifier 10 (FIG. 4) encased within the package and having leads 11*a* through 11*n* connected to appropriate portions of the amplifier. Complementary substrate assembly 12, shown in cross section in FIG. 2, comprises an alumina plate 13 0.022 inch thick with dimensions approximating that of package 9. The substrate may be titania, barium titanate, beryllia or similar ceramic materials having good heat conductivity and mechanical strength. Notches 14*a* through 14*n* are formed at the edges of plate 13 by any preferred perforating means and are spaced so as to accommodate leads 11*a* through 11*n*.

The components required to complete the packaged amplifier are located on the surface of plate 13. Resistors 15 and 16 are formed by thick film techniques while capacitors 17 and 18 can be formed on the surface or attached as a discrete component.

Referring to FIGS. 1 and 2, vitreous underglaze layers 19 and 20 are first applied to the plate surface under the areas where the resistors are to be formed. Electrodes 21 through 26 and conductive terminals 27*a* through 27*n* are next selectively screened onto the plate surface where they will form interconnections between components and between components and the packaged circuit as described later in this specification. The electrodes can be silver or any noble metal displaying high conductivity and fast adhesion to the plate surface. Thin resistive films 30 and 31 are then formed on layers 19 and 20 and overglaze layers 32 and 33 are formed over films 30 and 31. The techniques for forming such resistors on a substrate including composition of the glaze areas and resistivity, thickness and dimensions of the resistive films for required resistance values are well known to the art and a full description is contained in U.S. Pat. No. 3,370,262.

Capacitors 17 and 18 are discrete miniaturized components which can be formed to provide the desired capacitance in a number of ways. A preferred method, is to build up alternate layers of ceramic material with selectively deposited noble metal electrodes and firing the stack to form a vitrified chip. Capacitors ranging in value from 30 pf. to 1 $\mu$f. can be obtained in this manner. A detailed procedure for forming such capacitors is provided in U.S. Pat. No. 3,189,974. The chip capacitors are then set on plate 13 and anchored in place by applying solder tabs 34 and 35. These tabs contact the capacitor terminals (not shown) as well as the electrodes previously disposed and hence also serve to connect the capacitors into the interconnect pattern.

The interconnection between the components on the substrate and between the substrate and the DIP is shown in FIG. 3. Referring to FIGS. 1, 2 and 3, resistor 15 is connected to terminal 27*a* by element 21 and to terminal 27*j* and capacitor 17 by element 22; capacitor 17 is connected to terminal 27*i* by element 23; capacitor 18 is connected to terminal 27*e* by element 24; resistor 16 is connected to capacitor 18 and terminal 27*n* by element 25 and to terminal 27*l* by terminal 26.

Substrate 12 is connected to package 9 and amplifier 10 by lowering the package onto the substrate so that each lead 11*a*—*n* mates with corresponding cavity 14*a*—*n*. The package is lowered until elbow 36 of each lead rests against the surface of the substrate at the cavity areas. The components on the substrate are then housed beneath the package within the dimension designated *t*. A permanent connection is made by applying a conductive element (not shown) as by soldering, across the outside edge of each terminal 27 making sure that both terminal and the mating lead are simultaneously contacted. Electrical contact will be made to leads 11*a*, 11*e*, 11*j*, 11*l* and 11*n*; the remaining contacts provide adhesion to the assembly. The combination can then be inserted in place on a printed board by inserting the projecting ends of leads 11 into the appropriate board location.

From the above, it is seen that the compensating components have been more advantageously arranged and connected. The lateral area requirements previously met to house the components have been eliminated at the expense of a slight vertical enlargement. The requirement for discrete resistors has been eliminated since a substrate is now available for thick film deposition. The interconnections between components and between DIP leads are more reliable since they are made on one plane and are supported by the substrate surface. The only further connection now required is from the package leads to other packages or circuits.

Although the invention has been shown practiced with a plurality of components connecting to the package, a single compensating component may of course be placed on the substrate, the connection areas being accordingly reduced. The invention may also be practiced with a DIP having a different number of leads than 14 with substrate cavities and terminals being accordingly increased or reduced. Also, the mating cavities themselves may be holes rather than notches.

Since it is obvious that many changes and modifications can be made in the above-described details without departing from the nature and spirit of the invention it is to be understood that the invention is not limited to said details except as set forth in the appended claims.

I claim:

1. The combination of a dual in line package having two parallel rows of leads extending from and connected to the circuit encapsulated therein, with a connecting member which comprises:

a substrate of substantially the same dimensions as said package and in substantially close juxtaposition thereto, wherein said substrate includes two parallel rows of cavities therethrough with said leads passing through said cavities;

at least one electrical component located upon the surface of said substrate; and connecting means disposed on the surface of said substrate and electrically connecting said component to said package leads wherein the circuit enclosed within said package is modified to include said component.

2. The combination of claim 1 wherein said cavities have an adjoining conductive element and wherein said means electrically connecting said component to said package leads comprises:

a conductive member which electrically connects said component to an appropriate conductive element; and means electrically connecting said conductive element to the package lead passing through the associated cavity.

3. The combination of claim 1 including:

a plurality of electrical components located upon the surface of said substrate;

means disposed on the surface of said substrate and electrically interconnecting said components; and means disposed on the surface of said substrate and electrically connecting said components to said package leads, wherein the circuit enclosed within said package is modified to include said components.

4. The combination of claim 3 wherein said cavities have an adjoining conductive element and wherein said means electrically connecting said components to said package leads comprises:

a plurality of conductive members which electrically connect said components to appropriate conductive elements; and means electrically connecting said conductive elements with the package leads passing through the associated cavities.

5. The combination of claim 4 wherein at least one of said electrical components is a resistor formed as a thick conductive film on the surface of said substrate.